United States Patent [19]
Garnache et al.

[11] 3,841,926
[45] Oct. 15, 1974

[54] INTEGRATED CIRCUIT FABRICATION PROCESS

[75] Inventors: Richard Raymond Garnache, South Burlington; William Michael Smith, Jr., Williston, both of Vt.

[73] Assignee: International Business Machines Corporation, Armonk, N.Y.

[22] Filed: Jan. 2, 1973

[21] Appl. No.: 320,394

[52] U.S. Cl. .................. 148/188, 148/186, 148/187, 29/571, 317/235 B
[51] Int. Cl. .................. H011 7/34
[58] Field of Search .................. 148/188, 187, 186; 117/106 A; 29/571; 317/235 B

[56] References Cited

UNITED STATES PATENTS

| | | | |
|---|---|---|---|
| 3,387,286 | 6/1968 | Dennard | 317/235 B |
| 3,387,358 | 6/1968 | Heiman | 29/571 |
| 3,434,021 | 3/1969 | Hofstein | 317/235 R |
| 3,475,234 | 10/1969 | Kerwin et al. | 148/187 |
| 3,570,114 | 3/1971 | Bean et al. | 29/577 |
| 3,574,010 | 4/1971 | Brown | 148/187 |
| 3,602,782 | 8/1971 | Klein | 317/235 B |
| 3,604,107 | 9/1971 | Fassett | 29/571 |
| 3,672,948 | 6/1972 | Foehring et al. | 171/106 A |

*Primary Examiner*—G. Ozaki
*Attorney, Agent, or Firm*—Daniel E. Igo

[57] ABSTRACT

Integrated circuits of high density are fabricated in a simplified process which allows both the use of multiple conducting layers in a dielectric above a semiconductor substrate, such as a polycrystalline silicon (polysilicon) field shield and metal interconnection lines, while also making provision for very precise alignment of subsequent layers to diffusions. A doped oxide containing a suitable dopant, such as arsenic in the case of a p-type silicon substrate, is deposited on the substrate. A pattern corresponding to desired diffusions is generated by normal photolithographic and etching techniques. A second, undoped oxide layer is thermally grown over the semiconductor substrate, with dopant from the doped oxide simultaneously diffusing into areas of the substrate underlying the doped oxide. The undoped oxide serves to prevent autodoping. Thermally growing the undoped oxide layer converts a layer of the semiconductor surface not covered by doped oxide to the undoped oxide. Both oxide layers are then removed, leaving slight steps at the surface of the semiconductor substrate around the diffusion. The slight steps serve to allow very precise alignment of masks for subsequent process steps. Otherwise, the structure produced is very planar. An insulating layer, desirably a composite of silicon dioxide and silicon nitride in the case of a silicon substrate, is then formed on the substrate, followed by a layer of polycrystalline semiconductor, desirably doped to provide high conductivity. Openings are then etched in the polycrystalline semiconductor layer to allow formation of gate electrodes of FET's, contact to the substrate, and contact of a subsequent interconnection metallization to diffusions in some of the circuits. A second insulating layer, such as silicon dioxide, is then grown on the polycrystalline semiconductor layer. Contact holes are then made to diffusions in the substrate, the substrate itself, and the polycrystalline silicon. The deposition and etching of an interconnection layer on the second insulating layer completes fabrication of the integrated circuit.

14 Claims, 7 Drawing Figures

INTEGRATED CIRCUIT FABRICATION PROCESS

CROSS REFERENCE TO RELATED APPLICATION

A copending, commonly assigned, concurrently filed application by William M. Smith, Jr., entitled "Integrated Circuit Structure and Memory," covers an integrated circuit structure that may be made by the process described and claimed herein.

BACKGROUND OF THE INVENTION

1. Field of the Invention

This invention pertains to a process for fabricating an integrated circuit structure, more particularly to the fabrication of such a structure incorporating field effect transistors (FET's). Most especially, it relates to an integrated circuit fabrication process in which both a conductive layer serving as a field shield member and a conductive layer serving to interconnect devices in the integrated circuit may be provided while obtaining very precise alignment tolerances in an essentially planar integrated circuit structure. The process of this invention is specially suited for the fabrication of large capacity memory integrated circuit arrays.

2. Description of the Prior Art

FET integrated circuit memory arrays and processes for fabricating them are well-known at this time. For example, commonly assigned Dennard, U.S. Pat. No. 3,387,286 discloses such circuits and a process for making them. Although the teachings of the Dennard patent have been available for several years, such a simplified integrated circuit memory cell as described there is just now beginning to achieve commercial exploitation as integrated circuit process technology has become sophisticated enough to exploit many of the potential advantages of such a simple structure.

For example, one process innovation for FET integrated circuits is a self-aligned gate process, in which a conductive layer serving as a gate electrode of an FET also serves as a diffusion mask to form the current flow electrode diffusions. Such a process is described, for example, in U.S. Pat. No. 3,475,234.

Another process innovation is a doped oxide diffusion process to allow more precise control over diffusion dimensions than the previous diffusion processes utilizing a dopant atmosphere. Such doped oxide diffusion processes are disclosed, for example, in U.S. Pat. Nos. 3,574,010 and 3,604,107.

As integrated circuit density has become greater and greater, the problems of leakage currents and interference currents between adjacent integrated circuit devices have become more serious. The provision a conducting member within dielectric layers overlying a semiconductor substrate to serve as a field shield has been proposed. U.S. Pat. No. 3,602,782 and an article in Electronic News, Jan. 18, 1971, page 41 both disclose processes for fabricating integrated circuits including a polycrystalline silicon member serving as a field shield.

In order to meet the demands of large capacity memory applications, memory integrated circuits must be both highly dense and easily fabricated. A more detailed discussion of the requirements for such large capacity memory applications is contained in the above referenced Smith, Jr. application, the disclosure of which is incorporated by reference herein. In order to meet these requirements, an integrated circuit must both be easily fabricated, and hence inexpensive, and highly dense. For these reasons, very precise alignment tolerances of elements in the integrated circuit, the protection against leakage currents obtained with a field shield, and a highly planar structure would be desirable. However, a limitation on the self-aligned gate process itself has been its inability to allow multiple conducting member layers over a semiconductor substrate, without producing a highly non-planar structure.

SUMMARY OF THE INVENTION

Accordingly, it is an object of this invention to give an integrated circuit manufacturing process in which very precise alignment tolerances may be achieved without using a self-aligned gate process and with an essentially planar structure.

It is another object of the invention to allow precise alignment tolerances to be obtained in an essentially planar integrated circuit structure including a double conducting layer.

It is a further object of the invention to provide an integrated circuit fabrication process which gives slight steps on a semiconductor surface around diffusions that allow very precise registration of masks for subsequent mask levels and gives an otherwise highly planar structure.

It is still another object of the invention to provide a simplified process for fabricating an integrated circuit including FET's and a field shield within dielectric layers overlying the integrated circuit structure.

It is a still further object of the invention to provide an integrated circuit manufacturing process in which etching of different layers is carried out simultaneously to reduce the number of masking operations required in fabricating the integrated circuit.

The attainment of these and related objects may be achieved by using the integrated circuit fabrication process disclosed herein. In accordance with the invention, a first oxide layer containing a desired dopant is deposited on a semiconductor substrate. The first oxide is removed from all areas of the substrate except where a diffusion of the dopant is desired. A second, undoped oxide layer is thermally grown over the substrate. The temperatures used for the thermal growth operation simultaneously diffuse the desired dopant from the first oxide into areas of the substrate beneath the remaining first oxide. Further, the presence of the thermally grown second oxide serves to prevent autodoping from the doped oxide to regions of the semiconductor substrate not covered by the doped oxide. The thermal oxide growth step converts areas of the semiconductor surface not covered by the doped oxide to an oxide of the semiconductor, but does not convert a significant amount of the silicon to silicon dioxide in areas of the semiconductor surface covered by the doped oxide. Consequently, when the first and second oxide layers are removed from the surface of the substrate, a step is formed around the diffusions which facilitates mask alignment for subsequent process steps. A further advantage of forming the diffusions in this manner is that it is possible to form the diffusions with narrower widths than the doped oxide widths. While the reasons for this result are not completely clear, it is believed to be due to a tendency of the dopant to pull back from the thermally grown oxide, as well as a tendency for less dopant to be provided near the edges of a doped oxide, due to less thickness of the oxide there. In order to minimize autodoping further, the dopant in the doped oxide is preferably arsenic in the case of a p-type silicon semiconductor substrate. Further processing steps to complete the fabrication of the integrated circuit are then carried out.

For including a polycrystalline semiconductor field shield in an FET integrated circuit, these further process steps desirably include the following. A first insulating layer on the doped substrate is formed, desirably by chemical vapor deposition or thermal oxidation followed by chemical vapor deposition. A conductive semiconductor layer is then formed on the first insulating layer, again desirably by chemical vapor deposition, then etched in a desired field shield pattern. A second insulating layer is then thermally grown over the conductive semiconductor layer by oxidation of its surface. The thermally grown second insulating layer does not form materially on the first insulating layer if at least its upper surface is silicon nitride, in the case of a silicon substrate. Contact openings are then formed through the second insulating layer to the conductive semiconductor layer and through the first and second insulating layers to the substrate where contact to it is desired. A conducting layer is formed on the second insulating layer in electrical contact with the substrate in a desired pattern of interconnection lines and field effect transistor gate electrodes. Preferably, contact is made between the conductive semiconductor layer and the semiconductor substrate by an isolated portion of this conducting layer, as well.

While the process of this invention is particularly suited for the fabrication of a large capacity memory FET integrated circuit structure, such as is disclosed in the above referenced Smith, Jr. application, its simplicity and capability of producing a high density integrated circuit structure should make it of value in a wide variety of other integrated circuit applications as well.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figure 1:
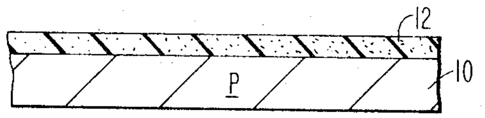
FIGS. 1–7 represent cross sections of a portion of an integrated circuit after successive process steps during fabrication in accordance with the process of this invention.

Turning now to the drawings, more particularly to FIG. 1, there is shown a p-type silicon substrate 10 having a silicon dioxide layer 12 on its surface containing an arsenic dopant. The doped oxide layer 12 is preferably formed by chemical vapor deposition. This may be done from a gaseous organosilicon compound, such as silane, oxygen and an arsenic containing gas, such as arsine, at an elevated temperature, such as between about 450° and 550° C.

Figure 2:
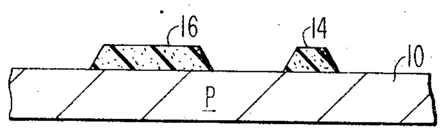

A standard photoresist application, exposure and development, followed by etching in hydrofluoric acid, is utilized to form doped oxide regions 14 and 16 on the surface of silicon substrate 10, with the remainder of doped oxide layer 12 being etched away as shown in FIG. 2. This step uses the first mask in the process to define the desired doped oxide regions 14 and 16.

Figure 3:
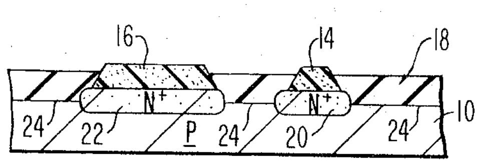

The diffusion step is now carried out by thermally growing silicon dioxide layer 18, shown in FIG. 3, over semiconductor substrate 10 and doped oxide areas 14 and 16. A temperature between about 1,050° and 1,150° C is used for the thermal oxidation to form layer 18. At these temperatures, arsenic diffuses from doped oxide layers 14 and 16 to form n-type diffused regions 20 and 22, respectively. The thermal oxidation process lowers the surface 24 of semiconductor substrate 10 to the level shown in FIG. 3 on those portions of the silicon substrate 10 not covered by doped oxide areas 14 and 16. Thermal oxide does grow on top of the doped oxide, but stead at a much lower rate between silicon and doped oxide layer than on the bare silicon, FIG. 3.

Figure 4:
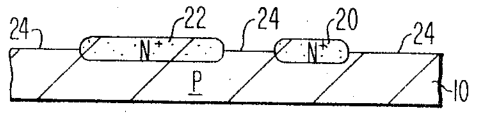

FIG. 4 shows the resulting structure after stripping off thermally grown oxide layer 18 and doped oxide areas 14 and 16, such as by use of a hydrofluoric acid stripping solution. As shown, there is a step between surface 24 of silicon substrate 10 and the diffusions 20 and 22, since the silicon in the diffusion regions was not significantly oxidized during growth of thermal oxide 18. This step has been exaggerated for purpose of clarity in the drawings, and typically is on the order of about 1,000 Angstroms. This step enables very precise visual alignment of subsequent masks used in the process to be made to the structure already defined.

Figure 5:
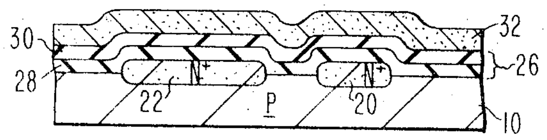

Fabrication of the integrated circuit continues with the chemical vapor deposition of an insulating layer composite 26 consisting of silicon dioxide layer 28, which can also be formed by thermal oxidation, and silicon nitride layer 30, shown in FIG. 5. The combined thickness of insulating layer composite 26 is preferably between about 400 and about 1,000 Angstroms, since this insulating layer will serve as the gate insulation of an FET. The ratio of thickness between silicon dioxide layer 28 and silicon nitride layer 30 is adjusted as desired to give optimum device characteristics for a particular integrated circuit. A polycrystalline silicon layer 32 having a thickness of between about 4,000 and 8,000 Angstroms is then deposited by chemical vapor deposition on insulating layer 26 to give the structure shown in FIG. 5. The polycrystalline silicon layer 32 is desirably doped to give it high conductivity with a suitable acceptor impurity, such as boron.

The silicon dioxide layer 28, silicon nitride layer 30 and polycrystalline silicon layer 32 are desirably formed in the same chemical vapor deposition process tube. Silicon dioxide layer 28 is desirably deposited by decomposition of silane in the presence of oxygen at a temperature of about 900°C in the process tube. Silicon nitride layer 30 is formed from an organosilane, such as silane, and ammonia at a decomposition temperature in the tube of about 900° C. Polysilicon layer 32 is formed by decomposition of silane in the presence of a boron containing gas, such as Diborane, at a temperature of about 900° C. A suitable chemical vapor deposition process tube for deposition of these layers is disclosed in commonly assigned Foehring et al., U.S. Pat. No. 3,672,948, the disclosure of which is incorporated by reference herein. The ability in the present process to form these three layers at once in a single process apparatus is highly significant from a process automation standpoint.

Figure 6:
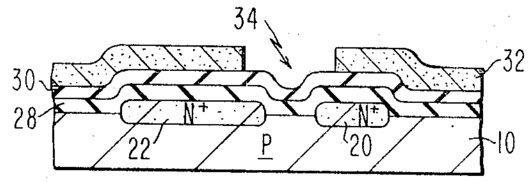

As shown in FIG. 6, an opening 34 is formed in polysilicon layer 32 to form a gate electrode of an FET, the current flow electrodes of which are formed by diffusions 20 and 22. Also, openings (not shown) are formed in the polycrstalline silicon layer 32 to allow contact from the layer 32 to substrate 10 and contact of subsequently deposited interconnection metallization to polycrystalliine silicon layer 32 and substrate 10. Photoresist is applied, exposed through a mask and developed in the usual manner to define these openings. This represents the second masking step required in the process. A suitable etchant for the polycrystalline silicon layer 32 is hydrofluoric acid and nitric acid in water or hydrofluoric acid, nitric acid, and acetic acid in admixture.

Figure 7:
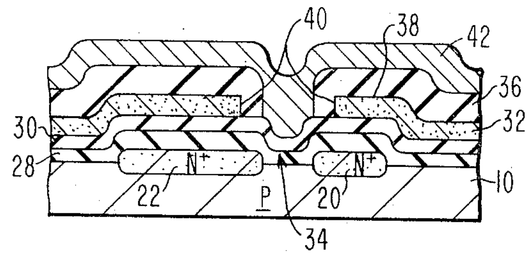

To complete fabrication of the integrated circuit, a second thermally grown insulating layer 36 is formed by oxidation of the surface of polysilicon layer 32, as shown in FIG. 7. In addition to the top surface 38 of polycrystalline silicon layer 32, edges 40 are also thermally oxidized to cover polysilicon layer 32 completely with oxide layer 36. About 30 percent of the as deposited polysilicon layer thickness is converted to the oxide layer 36. Only about 40 Angstroms of silicon dioxide forms on silicon nitride layer 30 in opening 34 because silicon dioxide will not grow readily on the surface of silicon nitride. For this reason, no etching step of insulating layer 36 to form the gate electrode of the FET including diffusions 20 and 22 is required. However, an etching step for silicon dioxide layer 36 is carried out both to allow contact down to polycrystalline silicon layer 32 and other portions of the integrated circuit and to allow contact to silicon substrate 10. Photoresist is applied in a desired masking pattern on silicon dioxide layer 36 for this purpose. This masking pattern covers opening 34 in polysilicon layer 32. This represents the third masking step in the process. In areas where contact to the substrate 10 is required, additional openings similar to opening 34 shown in FIG. 6 were defined in polycrystalline silicon layer 32. These are left uncovered by the photoresist. While silicon dioxide layer 36 is being etched, the silicon nitride layer 30 and silicon dioxide layer 32 are also etched where they are exposed. Since it is desired to leave silicon nitride layer 30 and silicon dioxide layer 32 intact between diffusions 20 and 22 to form the gate insulation of the FET, opening 34 is masked with photoresist during this etching step. A suitable etchant for the silicon dioxide layer 36 is hydrofluoric acid. The hydrofluoric acid also attacks the silicon nitride layer 30, but at a much lower rate than it attacks silicon dioxide layer 36. Since silicon dioxide layer 36 is much thicker than silicon nitride layer 30, etching of the silicon nitride layer 30 can be accomplished during the time silicon dioxide layer 36 is etched. When silicon nitride layer 30 has been etched, removal of the underlying thin silicon dioxide layer 28 where exposed occurs very rapidly.

An aluminum layer 42 is then vacuum evaporated to a thickness of about 10,000 Angstroms on the remaining silicon dioxide layer 36, in opening 34 to define the gate electrode of the FET, and also in contact openings at portions of the integrated circuit not shown in the drawings. A fourth mask is used to define an interconnection pattern and the gates in aluminum layer 42. As explained previously, isolated portions (not shown) of aluminum layer 42 are utilized to establish electrical contact between polycrystalline field shield layer 32 and semiconductor substrate 10. In practice, a further layer (not shown) of sputtered silicon dioxide may be provided over aluminum layer 42 for the purpose of passivating the integrated circuit, as is known in the art.

In a specific example, the process as described above is used to fabricate memory integrated circuits containing 32,000 memory bits together with on-chip decode and other support circuits in a silicon chip having dimensions of 162 by 182 mils. The electrical characteristics of such integrated circuits are discussed in the above referenced Smith, Jr. application. The process of this invention is especially suited for fabricating such large capacity memory integrated circuits. Its ability to produce very dense, fully field shielded integrated circuits in a simple manner should make it applicable to the fabrication of a wide variety of other integrated circuit types as well. It should further be apparent that a process capable of attaining the stated objects of this invention has been provided. The invention allows an integrated circuit having more than one conductive layer above a semiconductor substrate to be fabricated in a very simple manner in an essentially planar structure with alignment tolerances very close to those which may be obtained with a self-aligned gate integrated circuit fabrication process.

While the invention has been particularly shown and described with reference to a preferred embodiment thereof, it will be understood by those skilled in the art that various changes in form and details may be made therein without departing from the spirit and scope of the invention. For example, the polysilicon field shield layer 32 need not have a contact to the substrate 10 if the field shield is to be biased to a different potential than that of the substrate, as taught in the referenced Smith, Jr., application.

What is claimed is:

1. An integrated circuit fabrication process, which comprises:

A. depositing a first oxide layer containing a desired dopant on a semiconductor substrate, B. removing the first oxide from all areas of the substrate except where a diffusion of the dopant is desired, C. thermally growing a second oxide layer over the substrate and remaining portions of the first oxide layer, simultaneously diffusing the desired dopant from the first oxide into areas of the substrate beneath the remaining first oxide, D. removing the first and second oxide layers from the substrate, whereby a step is formed around the diffusions to facilitate mask alignment for subsequent process steps, and E. carrying out further process steps to complete the integrated circuit.

2. The process of claim 1 wherein the dopant is arsenic.

3. The process of claim 1 wherein the semiconductor substrate is silicon.

4. The process of claim 1 in which the further process steps to complete the integrated circuit comprise:

A. forming a first insulating layer on the doped substrate,

B. forming a conductive semiconductor layer on the first insulating layer in a pattern of a desired field shield, C. forming a second insulating layer over the conductive semiconductor layer, D. forming contact openings through the first and second insulating layers where contacts are desired, and E. forming a conducting layer on the second insulating layer in a desired pattern of interconnection lines and field effect transistor gate electrodes.

5. The process of claim 4 in which the dopant is arsenic.

6. The process of claim 5 in which the first insulating layer comprises a composite of silicon dioxide and silicon nitride.

7. The process of claim 6 in which the substrate and conductive semiconductor layer is silicon.

8. The process of claim 7 in which the second insulating layer is silicon dioxide and the conducting layer formed on the second insulating layer is aluminum.

9. An integrated circuit fabrication process, which comprises:

A. depositing a first silicon dioxide layer containing a desired dopant over a silicon substrate, B. removing the doped silicon dioxide layer from all areas of the substrate except where a diffusion of the dopant is desired in patterns defining current flow electrodes of at least one field effect transistor and an electrode of a capacitor, C. thermally growing a second silicon dioxide layer over the substrate and remaining portions of the first silicon dioxide layer, simultaneously diffusing the desired dopant from the first silicon dioxide layer into the silicon substrate beneath the remaining areas of the first silicon dioxide layer, D. removing the first and second silicon dioxide layers from the silicon substrate,
whereby a step is formed around the diffusions to facilitate mask alignment for succeeding process steps, E. thermally growing a third silicon dioxide layer on the silicon substrate, F. vapor depositing a silicon nitride layer on the third silicon dioxide layer, G. depositing a doped polycrystalline silicon layer having the same conductivity type as the silicon substrate on the silicon nitride layer, H. removing the polycrystalline layer in at least an area in which a gate electrode of the field effect transistor is to be formed and where contact holes are to be formed to the substrate and diffusions, I. growing a fourth thermal silicon dioxide layer over the remaining polycrystalline silicon, J. etching contact openings through the fourth silicon dioxide layer, the silicon nitride layer, and the third silicon dioxide layer to the substrate, K. depositing a conductive layer on the fourth thermal silicon dioxide, on the silicon nitride layer to form the gate electrode of the field effect transistor, and in the contact holes, and L. etching the conductive layer to give a desired interconnection pattern.

10. The purpose of claim 9 in which the dopant is arsenic.

11. The process of claim 9 in which portions of the polycrystalline layer are etched to form an interconnection pattern in a portion of the circuits being fabricated, and in which the fourth thermal oxide layer is etched down to the polycrystalline silicon layer in the same step as the etching of the silicon nitride and third silicon dioxide layer to form contact openings to the substrate.

12. In an integrated circuit fabrication process, the improvement for simultaneously forming diffusions and a step around the diffusions to serve as an aid for subsequent mask alignment, which comprises:

A. thermally growing an oxide layer over exposed portions of a semiconductor substrate and over a doped oxide on portions of the semiconductor substrate, and B. removing the thermally grown oxide and the doped oxide from the semiconductor surface.

13. The process of claim 12 in which the semiconductor substrate is silicon and the oxide is silicon dioxide.

14. The process of claim 13 in which the doped oxide contains arsenic as a dopant.

* * * * *

PO-1050
(5/69)

UNITED STATES PATENT OFFICE
CERTIFICATE OF CORRECTION

Patent No. 3,841,926 Dated October 15, 1974

Inventor(s) Richard Raymond Garnache and William Michael Smith, Jr.

It is certified that error appears in the above-identified patent and that said Letters Patent are hereby corrected as shown below:

Column 4, line 17, delete the word "stead" and insert the word --instead--;

line 19, delete "FIG. 3." and insert --resulting in a much thinner layer there.--.

Column 6, lines 49 and 50, delete "remaining portions of the first oxide layer,";

line 53, after the word "removing" insert --at least a portion of--;

delete lines 55 and 56;

line 57, delete "steps,".

Column 7, lines 32 and 33, delete "remaining portions of the first silicon dioxide layer,"

line 37, after the word "removing" insert --at least a portion of--;

delete lines 39, 40 and 41.

Column 8, line 19, delete the word "purpose" and insert --process--.

Signed and sealed this 4th day of February 1975.

(SEAL)
Attest:

McCOY M. GIBSON JR.
Attesting Officer

C. MARSHALL DANN
Commissioner of Patents